United States Patent [19]

Toita et al.

[11] Patent Number: 5,008,537
[45] Date of Patent: Apr. 16, 1991

[54] COMPOSITE APPARATUS WITH SECONDARY ION MASS SPECTROMETRY INSTRUMENT AND SCANNING ELECTRON MICROSCOPE

[75] Inventors: Hiroshi Toita, Katsuta; Hifumi Tamura, Hachioji; Issei Tobita, Ibaraki; Hiroshi Iwamoto, Katsuta, all of Japan

[73] Assignees: Hitachi, Ltd., Tokyo; Hitachi Instrument Engineering Co., Ltd., Ibaraki, both of Japan

[21] Appl. No.: 409,761

[22] Filed: Sep. 20, 1989

[30] Foreign Application Priority Data

Sep. 22, 1988 [JP] Japan ................. 63-236351

[51] Int. Cl.[5] ........................................... H01J 37/26
[52] U.S. Cl. ..................... 250/309; 250/285; 250/397; 250/423 R
[58] Field of Search ............... 250/285, 309, 310, 306, 250/396 R, 423 R, 397

[56] References Cited

U.S. PATENT DOCUMENTS

| | | | |
|---|---|---|---|
| 3,831,026 | 8/1974 | Powers | 250/285 |
| 4,564,758 | 1/1986 | Slodgian et al. | 250/285 |
| 4,740,698 | 4/1988 | Tomura et al. | 250/309 |
| 4,818,872 | 4/1989 | Parker et al. | 250/309 |
| 4,835,399 | 5/1989 | Hosaka et al. | 250/396 R |

FOREIGN PATENT DOCUMENTS 59-68159 4/1984 Japan.

*Primary Examiner*—Bruce C. Anderson
*Attorney, Agent, or Firm*—Antonelli, Terry, Stout & Kraus

[57] ABSTRACT

A composite apparatus is disclosed which includes in combination a secondary ion mass spectrometry instrument and a scanning electron microscope. A liquid metal ion source and an ion source other than the liquid metal ion source are installed in the same apparatus so that an ion beam emitted from the liquid metal ion source and an ion beam emitted from the ion source other than the liquid metal ion source are aligned with each other on a primary beam axis which is an optical axis of an irradiating system. The liquid metal ion source is disposed in rear of a primary ion separating device which mass-separates the ion beam emitted from the ion source other than the liquid metal ion source. Further, an electron gun is installed in the same apparatus so that an electron beam emitted from the electron gun is aligned with the ion beam on the primary beam axis.

16 Claims, 1 Drawing Sheet

COMPOSITE APPARATUS WITH SECONDARY ION MASS SPECTROMETRY INSTRUMENT AND SCANNING ELECTRON MICROSCOPE

BACKGROUND OF THE INVENTION

The present invention relates to a composite apparatus which includes in combination a secondary ion mass spectrometry instrument (hereinafter referred to as SIMS instrument) using an ion beam and a scanning electron microscope (hereinafter referred to as SEM) using an electron beam, and more particularly to a composite apparatus with SIMS instrument and SEM provided with a liquid metal ion source which effects a local analysis of a submicron region as well as a high-resolution observation of the same location as the region to be analyzed and an SEM which effects a high-resolution observation of the same location as the region to be analyzed.

In an SIMS instrument, an ion beam emitted from an ion source is used as a primary beam with which a specimen is irradiated. In an SEM, on the other hand, an electron beam is used as a primary beam.

An ion source for the conventional SIMS instrument which is widely used a duo-plasmatron type ion source using a plasma or a surface ionization type ion source using a surface ionizing mechanism. However, such an ion source is not suitable for local analysis of a submicron region (in the order of several-thousands angstroms) since the source has a relatively large diameter on the order of 0.2 to 1 mm $\phi$.

In recent years, a liquid metal ion source has been developed and put into practical use as an ion source which has a high brightness and a minute point source (having a spot diameter not greater than several-hundreds angstroms). In the liquid metal ion source, a metal in a melted state is supplied to the tip (or pointed end) of a needle-like chip having a diameter on the order of microns and a strong electric field is applied to the tip of the needle-like chip to form a sharp cone of melted metal, thereby causing ion emission based on a field emission mechanism.

However, an apparatus having plural kinds of ion sources and which is capable of properly selecting any one of those ion sources through a simple operation such as a change-over operation has not bee known. On the other hand, a composite electron beam apparatus having an SIMS instrument using an ion source and an SEM using an electron beam has been disclosed by, for example, JP-A-59-68159. The ion source used in the SIMS instrument of the disclosed composite electron beam apparatus is a duo-plasmatron type ion source or a surface ionization type ion source. There has not been an SIMS instrument which has a liquid metal ion source in addition to the duo-plasmatron type ion source or the surface ionization type ion source.

As mentioned above, there have been neither an SIMS instrument which has a liquid metal ion source and an ion source other than the liquid metal ion source nor a composite apparatus with SIMS instrument and SEM which has a liquid metal ion source and an electron beam source. Therefore, the following problems exist.

(1) In the case where it is desired to make a local analysis of a submicron region which cannot be analyzed by a duo-plasmastron type ion source or a surface ionization type ion source, the ion source must be exchanged for a liquid metal ion source, thereby requiring a long time for the ion source exchange, exhaustion, beam axis adjustment, etc.

(2) In the case where it is desired to conduct a local analysis using an ion source and a high-resolution observation of the same location as a region to be analyzed, two apparatuses or an SEM and an SIMS instrument must be used, thereby requiring a long time for specimen exchange, exhaustion, beam axis adjustment, etc.

(3) In general, an SIMS instrument having as an ion source a duo-plasmatron type ion source or a surface ionization type ion source is provided with a primary ion separating device for eliminating impurity ion beams or neutral particle beams included in the desired ion beam. Therefore, even if one tries to merely install a liquid metal ion source into the conventional composite ion beam apparatus having the duo-plasmatron type ion source or the surface ionization type ion source, an ion beam emitted from the liquid metal ion source will be affected by a deflection magnetic field originating from a mass separation magnetic field in the primary ion separating device so that a deflection aberration is increased and hence the astigmatism of the ion beam will become large, thereby making a local analysis of a submicron region which is characteristic of the liquid metal ion source impossible.

(4) In the case where a local analysis of a submicron region is to be made by use of a liquid metal ion source, it is necessary to change ion seeds such as $Ga^+$, $Li^+$ and $Au^+$ in order to enhance the detection sensitivity in accordance with the electronegativity of an element to be measured. In the conventional SIMS instrument, liquid metal ion sources for various ion seeds must be exchanged on each occasion, thereby requiring a long time for ion source exchange, exhaustion, beam axis adjustment, etc.

SUMMARY OF THE INVENTION

An object of the present invention is to solve the above-mentioned problems or to provide a composite apparatus with an SIMS instrument and SEM in which a time for an operation including specimen exchange or ion source exchange, exhaustion and beam axis adjustment can be shortened and a local analysis of a minute region by an ion beam and a high-resolution observation of the same location as the region to be analyzed can be effected by one apparatus.

To that end, the present invention provides for a liquid metal ion source and an ion source other than the liquid metal ion source to be installed in the same apparatus so that an ion beam emitted from the liquid metal ion source and an ion beam emitted from the ion source other than the liquid metal ion source are aligned with each other on a primary beam axis which is an optical axis of an irradiating system. The liquid metal ion source is disposed in the rear of a primary ion separating device which mass-separates the ion beam emitted from the ion source other than the liquid metal ion source.

The present invention is further characterized in that an electron gun is also installed in the same apparatus so that an electron beam emitted from the electron gun is aligned with the ion beam on the primary beam axis. The electron gun is disposed in the rear of the primary ion separating device which mass-separates the ion beam emitted from the ion source other than the liquid metal ion source.

With the above-mentioned construction, since both a microanalysis using the ion beam from the ion source (such as a duo-plasmatron type ion source or a surface ionization type ion source) other than the liquid metal ion source and a microanalysis of a submicron region using the ion beam from the liquid metal ion source can be effected by one apparatus, it is possible to greatly shorten a time of operation including ion source exchange, exhaustion and beam axis adjustment.

Also, since the liquid metal ion source is disposed in the rear of the primary ion separating device and a mass separation magnetic field, the ion beam emitted from the liquid metal ion source is not affected by the mass separation magnetic field and therefore results in an ion beam which is free of any deflection aberration and suitable for the submicron region.

Further, since the electron beam emitted from the electron gun is aligned with the primary beam axis and the electron beam is not affected by the mass separation magnetic field, a local analysis by an ion beam and a high-resolution observation of the same location as the region to be analyzed can be effected by one apparatus.

DESCRIPTION OF THE PREFERRED EMBODIMENTS

Figure 1:
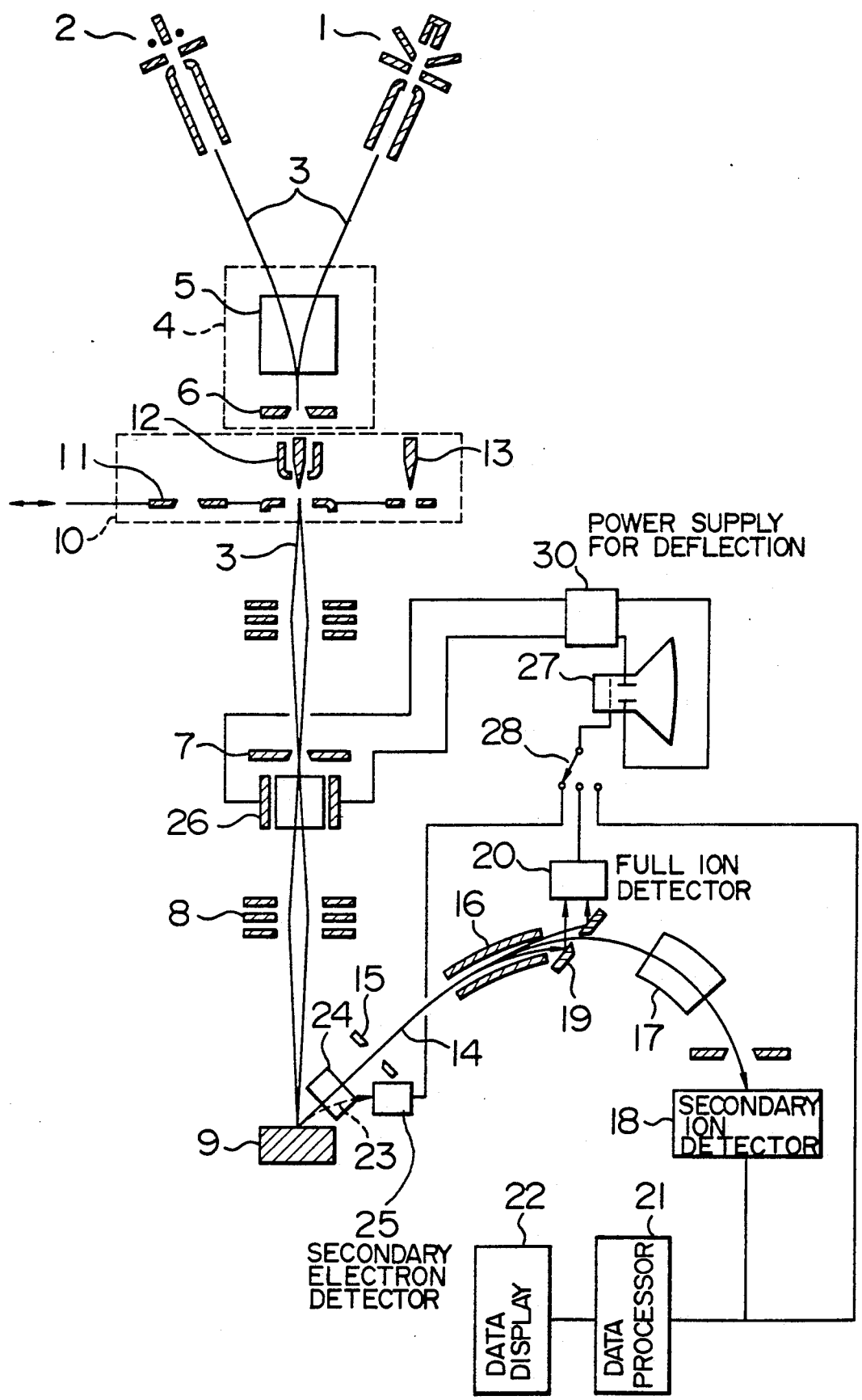
FIG. 1 is a view showing the construction of a composite apparatus with SIMS instrument and SEM according to an embodiment of the present invention.

FIG. 1 shows a block diagram of a composite apparatus with SIMS instrument and SEM according to an embodiment of the present invention. The composite apparatus has a structure which includes an electron gun for generating an electron beam and ion sources for generating ion beams.

A duo-plasmatron type ion source 1 is an ion source using a plasma and a surface ionization type ion source 2 is an ion source using a surface ionizing mechanism. Each of the ion beams from those ion sources is used as a primary beam upon microanalysis of a specimen.

A primary ion beam 3 emitted from the ion source 1 or 2 is mass-separated by a primary ion separating device 4 which may be a Wien filter system. By changing the polarity of a mass separation magnetic field generated by a mass separation magnetic field generating means 5, the selection of the duo-plasmatron type ion source 1 or the surface ionization type ion source 2 is effected and the axis of an ion beam from each of the ion sources 1 and 2 is brought into alignment with a primary beam axis which is an optical axis of an irradiating system.

Only ions having a desired mass number are extracted from the mass-separated primary ion beam by a mass separation aperture 6.

A liquid metal ion source 12 used as a source for generation of a primary beam upon microanalysis of a submicron region and a field emission electron gun 13 used as a source for generation of a primary beam upon high-resolution observation of the same location as the region to be analyzed are incorporated into a liquid metal ion source/field emission electron gun change-over mechanism 10.

The change-over mechanism 10 is movable in a lateral direction as indicated by the arrow in FIG. 1. When the ion beam emitted from the liquid metal ion source 12 is to be used as a primary beam, the liquid metal ion source 12 in the change-over mechanism 10 is moved to a position where the ion beam from the liquid metal ion source 12 is aligned with the primary beam axis. When the electron beam emitted from the field emission electron gun 13 is to be used as a primary beam, the electron gun 13 is moved to a position where the electron beam from the electron gun 13 is aligned with the primary beam axis. When the ion beam emitted from the duo-plasmatron type ion source 1 or the surface ionization type ion source 2 is to be used as a primary beam, the center of a beam pass aperture 11 is moved to the primary beam axis so that the primary beam is passed as it is. In this manner, an ion beam or electron beam from any one of the duo-plasmatron type ion source 1, the surface ionization type ion source 2, the liquid metal ion source 12 and the field emission electron gun 13 is selectively used upon occasion.

With the construction as mentioned above, since a microanalysis of a region relatively larger than a submicron region using an ion beam from the duo-plasmatron type ion source 1 or the surface ionization type ion source 2, a microanalysis of a submicron region using an ion beam from the liquid metal ion source 12, and a high-resolution observation of the same location as the region to be analyzed can be effected by one apparatus, it is possible to greatly shorten a time of operation including ion source exchange or specimen exchange, exhaustion and beam axis adjustment. The high-resolution observation is possible not only in the case of using the electron beam from the field emission electron gun 13 but also in the case of using the ion beam from the liquid metal ion source 12.

Further, since the liquid metal ion source 12 is disposed in the rear of the primary ion separating device 4 and the mass separation magnetic field generating means 5, the ion beam emitted from the liquid metal ion source 12 is not affected by the mass separation magnetic field and therefore results in an ion beam which is free of any deflection aberration and suitable for the submicron region. Furthermore, since the electron gun 13 is also disposed in the rear of the primary ion separating device 4 and the mass separation magnetic field generating means 5, the electron beam emitted from the electron gun 13 is not affected by the magnetic field and therefore results in an electron beam which is suitable for high-resolution observation.

In the present embodiment, one kind of liquid metal ion source has been incorporated into the changeover mechanism 10. If plural kinds of liquid metal ion sources are incorporated and each of those sources can be moved to the primary beam axis, it is possible to greatly shorten a time for operation including ion source exchange, exhaustion and beam axis adjustment.

The electron gun for generating the electron beam is not limited to the field emission electron gun but may be a thermionic emission electron gun or another type of electron gun.

In the present embodiment, explanation has been made in conjunction with the composite apparatus with SIMS instrument and SEM in which the duo-plasmatron type ion source 1 and the surface ionization type ion source 2 are used as ion sources for usual microanalysis However, the present invention is not limited to such an example. The present invention is applicable to any composite apparatus with SIMS instrument and SEM which has a liquid metal ion source and any ion source other than the liquid metal ion source.

An objective lens aperture 7 defines the diameter of the primary beam and a deflection electrode 26 lasterscans the primary beam on a specimen 9 to display an image. An electrostatic/magnetic lens 8, which is the combination of an electrostatic lens and a magnetic lens, is used as an electrostatic lens when focusing, an ion beam an electron beam for usual analysis and as a magnetic lens when focusing an electron beam for a high-resolution observation with less spherical aberration.

Secondary ions 14 emitted from the specimen 9 by irradiation thereof with the primary beam are passed through an entrance slit 15, energy-separated by a sector electric field generated by a sector electric field generating means 16, mass-separated by a sector magnetic field generated by a sector magnetic field generating means 17, and thereafter are detected by a secondary ion detector 18.

The detected secondary ion signal is processed by a data processor 21 and the resultant mass spectrum is displayed on a data display 22.

The secondary ions passed through the sector electric field generated by the sector electric field generating means 16 are converted by an ion/electron converter 19 into electrons and are detected by a full ion detector 20.

With such a construction, all ions emitted from the specimen 9 in the same direction and secondary ions of a specified substance can be simultaneously detected. Therefore, if information obtained by the secondary ion detector 18 and information obtained by the full ion detector 20 are compared with each other by a comparing means such as a ratio amplifier, any influence of the variation of a primary ion current, unevenness of the surface of the sample, and degeneration layer such as an oxidation layer of the surface of the sample as a result of analysis can be corrected thereby making a more accurate analysis possible. Since the comparison and analysis mentioned above is known, any further explanation thereof will be omitted.

Secondary electrons 23 emitted from the specimen 9 are deflected by a secondary electron deflecting magnetic field generated by a secondary electron deflecting magnetic field generating means 24 and are detected by a secondary electron detector 25.

A signal to a CRT 27 for image observation is supplied from any one of the secondary ion detector 18, the full ion detector 20 and the secondary electron detector 25 which is selected by an image selecting circuit 28.

As is apparent from the foregoing, the present invention provides the following effects.

(1) Since both a microanalysis using an ion beam from a duo-plasmatron type ion source or a surface ionization type ion source and a microanalysis of a submicron region using an ion beam from a liquid metal ion source can be effected by one apparatus, it is possible to greatly shorten a time of operation including ion source exchange or specimen exchange, exhaustion and beam axis adjustment.

(2) Since a liquid metal ion source is disposed in rear of a primary ion separating device and a mass separation magnetic field, an ion beam emitted from the liquid metal ion source is not affected by the mass separation magnetic field and therefore results in an ion beam which is free of any deflection aberration and suitable for a submicron region.

(3) Since the apparatus can be constructed so that plural kinds of liquid metal ion sources are moved to align with a primary beam axis, it is possible to greatly shorten a time for operation including ion source exchange, exhaustion and beam axis adjustment.

(4) Since an electron gun is installed so that an electron beam emitted from the electron gun is aligned with a primary beam axis, it is possible to conduct a high-resolution observation of the same location as a region to be subjected to local analysis by an ion beam.

(5) Since a composite lens of an electrostatic lens and a magnetic lens is used as a focusing lens, it is possible to make a change into an electrostatic lens with a focal distance independent of the mass number of ions upon focusing of an ion beam and into a magnetic lens with less spherical aberration upon high-resolution observation using an electron beam. Namely, the optimum lens can be readily selected in accordance with whether a primary beam is an electron beam or an ion beam.

(6) Since a detector for image observation is provided between a sector electric field and a sector magnetic field, it is possible to simultaneously detect all ions emitted from a specimen in the same direction and not subjected to mass separation, specified secondary ions subjected to mass separation, and secondary electrons. Therefore, any influence of the variation of a primary ion current on the result of the analysis can be corrected.

We claim:

1. A composite apparatus with secondary ion mass spectrometry instrument and scanning electron microscope comprising:
   at least one kind of liquid metal ion source;
   an ion source other than said liquid metal ion source;
   a primary ion separating device for mass-separating an ion beam emitted from said ion source other than said liquid metal ion source;
   deflecting means for bringing the ion beam from said ion source other than said liquid metal ion source into alignment with a primary beam axis which is an optical axis of an irradiating system;
   moving means for moving a position of said liquid metal ion source so that an ion beam emitted from said liquid metal ion source is aligned with said primary beam axis;
   an electron gun for emitting an electron beam;
   moving means for moving a position of said electron gun so that the electron beam emitted from said electron gun is aligned with said primary beam axis;
   focusing means for focusing the ion beam or the electron beam to irradiate a specimen with the focused beam;
   detecting means for detecting secondary electrons and secondary ions emitted from said specimen;
   analyzing means for analyzing said specimen on the basis of a signal from said detecting means; and
   said liquid metal ion source or said electron gun being disposed between said primary ion separating device and said specimen.

2. A composite apparatus with secondary ion mass spectrometry instrument and scanning electron microscope according to claim 1, wherein said liquid metal ion source and said electron gun are moved by the same moving means.

3. A composite apparatus with secondary ion mass spectrometry instrument and scanning electron microscope according to claim 2, wherein said moving means includes an aperture for passing therethrough the ion beam emitted from said ion source other than said liquid metal ion source.

4. A composite apparatus with secondary ion mass spectrometry instrument and scanning electron microscope according to claim 1, wherein said moving means includes an aperture for passing therethrough the ion beam emitted from said ion source other than said liquid metal ion source.

5. A composite apparatus with secondary ion mass spectrometry instrument and scanning electron microscope according to claim 1, wherein said focusing means includes an electrostatic/magnetic lens which has a function as an electrostatic lens and a function as a magnetic lens.

6. A composite apparatus with secondary ion mass spectrometry instrument and scanning electron microscope according to claim 1, wherein the secondary ion detecting means includes a sector electric field generating means, a sector magnetic field generating means disposed in rear of said sector electric field generating means, a full ion detector disposed between said sector electric field generating means and said sector magnetic field generating means, and a secondary ion detector disposed in rear of said sector magnetic field generating means.

7. A composite apparatus with secondary ion mass spectrometry instrument and scanning electron microscope according to claim 1, wherein said ion source other than said liquid metal ion source includes at least one of a duo-plasmatron type ion source and a surface ionization type ion source.

8. A secondary ion mass spectrometry instrument having a wide range of observed resolution comprising:
   at least two kinds of primary ion sources emitting at least one ion beam;
   a primary ion separating device for mass-separating said ion beam;
   deflecting means for bringing said ion beam into alignment with a primary beam axis of an irradiating system.
   at least one kind of liquid metal ion source which emits an ion beam, said liquid metal ion source being disposed between said primary ion separating device and a specimen;
   moving means for moving a position of said liquid metal ion source so that an ion beam emitted from said liquid metal ion source is aligned with said primary beam axis;
   focusing means for focusing at least one of said at least one ion beam emitted from said at least two kinds of primary ion sources and said ion beam emitted from said liquid metal ion source so as to irradiate said specimen with the focused beam;
   detecting means for detecting secondary ions emitted from said specimen; and
   analyzing means for analyzing said specimen on the basis of a signal from said detecting means.

9. A composite apparatus with a secondary ion mass spectrometry instrument and scanning electron microscope according to claim 8, wherein said moving means includes an aperture for passing therethrough the at least one ion beam emitted from said at least two kinds of primary ion sources, said moving means moving a position of said aperture so that said aperture is aligned with said primary beam axis.

10. A composite apparatus with a secondary ion mass spectrometry instrument and a scanning electron microscope comprising:
    at least two kinds of primary ion sources emitting at least one ion beam;
    an ion separating device for mass-separating said at least one ion beam;
    deflecting means for brining said at least one ion beam into alignment with a primary beam axis which is an optical axis of an irradiating system;
    an electron gun for emitting an electron beam, said electron gun being disposed between said ion separating device and a specimen;
    means for moving a position of said electron gun so that said electron beam is aligned with said primary beam axis;
    focusing means for focusing at least one of said at least one ion beam emitted from said at least two kinds of primary ion sources and said electron beam emitted from said electron gun so as to irradiate said specimen with the focused beam;
    detecting means for detecting at least one of secondary ions, secondary electrons, reflected electrons, X-rays and light which emerge from said specimen; and
    analyzing means for analyzing said specimen on the basis of a signal from said detecting means.

11. A composite apparatus with a secondary ion mass spectrometry instrument and scanning electron microscope according to claim 10, further comprising:
    at least one kind of liquid metal ion source which emits an ion beam, said liquid metal ion source being disposed between said ion separating device and said specimen;
    means for moving a position of said liquid metal ion source so that said ion beam emitted from said liquid metal ion source is aligned with said primary beam axis;
    wherein said focusing means focuses at least one of the at least one ion beam emitted from said at least two kinds of primary ion sources, the ion beam from said liquid metal ion source and the electron beam emitted from said electron gun so as to irradiate said specimen with the focused beam.

12. A composite apparatus with a secondary ion mass spectrometry instrument and scanning electron microscope according to claim 11, wherein said liquid metal ion source and said electron gun are moved by a single moving means.

13. A composite apparatus with a secondary ion mass spectrometry instrument and scanning electron microscope according to claim 12, wherein said single moving means includes an aperture for passing therethrough the at least one ion beam emitted from said at least two kinds of primary ion sources, said moving means moving a position of said aperture so that said aperture is aligned with said primary beam axis.

14. A composite apparatus with a secondary ion mass spectrometry instrument and scanning electron microscope according to claim 13, wherein said at least two kinds of primary ion sources comprise a duo-plasmatron type ion source and a surface ionization type ion source.

15. A composite apparatus with a secondary ion mass spectrometry instrument and scanning electron microscope according to claim 11, wherein at least one of said means for moving a position of said electron gun and said means for moving a position of said liquid metal ion source includes an aperture for passing therethrough the at least one ion beam emitted from said at least two kinds of primary ion sources, said at least one means for moving being operative to move a position of said aperture so that said aperture is aligned with said primary beam axis.

16. A composite apparatus with a secondary ion mass spectrometry instrument and scanning electron microscope according to claim 10, wherein said means for moving a position of said electron gun includes an aperture for passing therethrough the at least one ion beam emitted from said at least two kinds of primary ion sources, said means for moving a position of said electron gun moving a position of said aperture so that said aperture is aligned with said primary beam axis.

* * * * *